United States Patent [19]
Lin et al.

[11] Patent Number: 5,870,268
[45] Date of Patent: Feb. 9, 1999

[54] EARLY TRIGGER OF ESD PROTECTION DEVICE BY A CURRENT SPIKE GENERATOR

[75] Inventors: Shi-Tron Lin; Du-Zen Peng, both of Hsinchu; Shyh-Chyi Wong, Taichung, all of Taiwan

[73] Assignee: Winbond Electronics Corp., Hsinchu, Taiwan

[21] Appl. No.: 954,945

[22] Filed: Oct. 22, 1997

[51] Int. Cl.$^6$ .................................................... H02H 3/22
[52] U.S. Cl. .......................... 361/111; 361/56; 257/355
[58] Field of Search ................................ 361/56–58, 91, 361/92, 111, 212, 245; 257/360, 361, 355–356

[56] References Cited

U.S. PATENT DOCUMENTS

| | | |
|---|---|---|
| 4,503,448 | 3/1985 | Miyasaka . |
| 5,173,755 | 12/1992 | Co et al. .................................. 257/361 |
| 5,218,222 | 6/1993 | Roberts . |
| 5,272,371 | 12/1993 | Bishop et al. . |
| 5,290,724 | 3/1994 | Leach . |
| 5,508,224 | 4/1996 | Jang . |
| 5,545,910 | 8/1996 | Jang . |
| 5,565,790 | 10/1996 | Lee ............................................. 326/30 |
| 5,719,733 | 2/1998 | Wei et al. ................................... 361/56 |
| 5,745,323 | 4/1998 | English ...................................... 361/56 |

OTHER PUBLICATIONS

A. Amerasekera, et al., Substrate Triggering and Salicide Effects on ESD Performance and Protection Circuit Design in Deep Submicron CMOS Processes, IEDM–95, pp. 547–550.

A. Amerasekera, et al., ESD in Silicon Integrated Circuits, John Wiley & Sons, pp. 40–48 and 68–72.

*Primary Examiner*—Jeffrey A. Gaffin
*Assistant Examiner*—Kim N. Huynh
*Attorney, Agent, or Firm*—Proskauer Rose LLP

[57] ABSTRACT

A transient switching circuit is provided to generate a voltage signal with fast voltage switching phenomenon during the initial ESD transient. The voltage signal is applied to a current spike generator for generating a current spike which forward bias an n+/pwell diode for injecting minority carriers into a substrate on which ESD protection device is embodied. The injected minority carriers are used to trigger turn-on of the ESD protection device. These minority carriers flow toward the drain-substrate junction of the NMOS transistor such that the NMOS transistor is triggered at a trigger voltage lower than that provided by the prior arts. The present invention improves the ESD performance of an ESD protection device, such as a MOSFET or bipolar transistor, which is provided for protecting the power bus or IC pins during an ESD event.

34 Claims, 6 Drawing Sheets

EARLY TRIGGER OF ESD PROTECTION DEVICE BY A CURRENT SPIKE GENERATOR

FIELD OF INVENTION

The present invention relates to ESD protection circuit on a semiconductor device.

BACKGROUND OF THE INVENTION

In order to protect the integrated circuit from damages possibly caused by electrostatic discharge (ESD) event, different efforts have been made by the industries. Transistors, such as grounded-gate NMOS (GGNMOS), gate-coupled NMOS (GCNMOS), field-oxide MOSFET, output buffer transistors, or bipolar transistors, have been commonly used as primary ESD protection elements for integrated circuits. A diode also can be used as an ESD protection device by avalanche breakdown during an ESD event.

For ESD protection of an IC pin or a power bus, GGNMOS (grounded-gate NMOS) or GCNMOS (gate-coupled NMOS) can be used as the primary ESD protection. The drain of the NMOS transistor is connected to VDD or the IC pin, while the source of the NMOS transistor is connected to VSS. The gate is either grounded (GGNMOS), or coupled to VDD by a capacitor and to VSS by a resistor (GCNMOS). A bipolar transistor or other ESD protection circuit can also be used for ESD protection. The VDD to VSS voltage difference may increase rapidly to higher than 10 volts during an ESD event such as the following situations: (i) positive voltage stress of VDD pin to VSS pin, (ii) negative voltage stress of VSS pin to VDD pin, (iii) positive voltage stress on an input or I/O pin while the pin is connected to a pull-up (p+/nwell) diode or a pull-up PMOS, (iv) negative voltage stress on an input or I/O pin while the pin is connected a pull-down (n+/pwell) diode or a pull-down NMOS, or (v) positive voltage stress across one IC pin and another IC pin.

The ESD protection of a MOSFET (bipolar transistor as well) heavily depends on the triggering of a snap-back mechanism for conducting large amount of ESD current between the drain and source of MOSFET. To start, the high electric field at the drain-substrate junction causes impact ionization with generation of both minority and majority carriers. The minority carriers are collected at the drain (anode), while the majority carriers flow toward the substrate or pwell contact (cathode) causing a local potential build up in the pwell. When the local substrate potential is 0.8 V higher than the adjacent n+ source potential, the source-substrate junction becomes forward biased. The forward-biased source-substrate junction injects minority carriers into the pwell. Some of those injected minority carriers are recombined in the substrate while the rest of them reach the drain-substrate junction to further enhance the impact ionization. And due to a continuous loop (positive feedback), the MOSFET gets into a low impedance (snapback) state to conduct large amount of ESD current. As a diode is used as an ESD protection device, the injected minority carriers, when collected in the reverse-biased diode junction during an ESD event, triggers the avalanche breakdown earlier due to carriers multiplication.

In an ESD event, the triggering of an NMOSFET or bipolar ESD protection device is typically initiated by the avalanche breakdown of the reverse-biased diffusion-substrate junction (drain-substrate or collector-substrate junction). The trigger voltage is typically around 12 or 13 volt. It is of great advantage to lower the trigger voltage of a MOSFET (or bipolar transistor) during an ESD event. As the ESD protection occurs sooner, the transient voltage imposed on the I/O and internal circuit is lower which offers better overall ESD protection. When minority carriers (electrons) are present in the reverse-biased diffusion-substrate junction, due to carrier multiplication from impact ionization, the trigger voltage is reduced and the integrated circuit can be better protected in an ESD event.

The prior art, "ESD in Silicon Integrated Circuits" by A. Amerasekera and C. Duvvury, Chap. 3 and Chap. 4, John Wiley & Sons, 1995, hereinafter Ref. 1, describes in details the mechanism of ESD protection circuit. Among prior arts approaches, U.S. Pat. No. 5,366,908 discloses a process for fabricating a MOS device with protection against ESD. The Ref. 1 and U.S. Pat. No. 5,272,371 use a trigger device with a lower trigger voltage than that of the ESD protection device. Once the trigger device reaches avalanche breakdown, lots of carriers are generated and some of them flow in the substrate to induce the trigger of the ESD protection device. Usually, additional implant or a special process recipe is needed, as disclosed in the U.S. Pat. No. 5,272,371, to adjust the trigger voltage of the trigger device, such that it is lower than the trigger voltage of the ESD protection device. The U.S. Pat. No. 5,218,222 discloses another ESD protection circuit which applicable for output and input pads. The U.S. Pat. No. 5,290,724 discloses another process for forming ESD protection circuit. The U.S. Pat. No. 5,508,224 discloses another process for forming ESD protection circuit. The U.S. Pat. No. 5,545,910 discloses another ESD protection circuit. Another prior art "Substrate Triggering and Salicide Effects on ESD Performance and protection Circuit Design in Deep Submicron CMOS Processes" presented by Amerasekera et al. in 1995 IEDM conference paper, lowers the trigger voltage of an ESD protection device by forward biasing a pull-up diode (p+/nwell diode) connected between the input pin and VDD bus. Through the reverse-biased nwell-to-pwell junction, some carriers are collected into the pwell to help triggering the ESD protection device in the pwell. Usually, a method of this nature creates a parasitic SCR (pnpn) path with a reverse-biased nwell/pwell junction, and the latch-up immunity issue therewith needs special design considerations.

U.S. Pat. No. 5,399,928 describes a method of generating negative voltage from a positive voltage source. The negative voltages are typically generated during IC operation and is used for back-bias generator or for the erase operation of Flash memory cells.

SUMMARY OF THE INVENTION

The present invention relates to reduction of the trigger voltage of an ESD protection device through the generation of a single negative current spike during an ESD transient, such as the positive voltage stress of an IC pin (Input, I/O or VDD pin) to the VSS pin.

In the present invention, a negative voltage which is lower than VSS is generated at a switch point during a positive-stress, pin-to-VSS (input, I/O or VDD pin) ESD transient. The corresponding negative current spike applied to the cathode node of an n+/pwell diode causes forward biasing of the diode and the injection of electrons into the pwell. These injected electrons (minority carriers in the pwell), when collected in the reversed-biased diffusion-substrate junction of the NMOSFET (or bipolar) ESD protection device, reduce the trigger voltage of the ESD protection device.

DETAILED DESCRIPTIONS OF THE PREFERRED EMBODIMENTS

Figure 1:
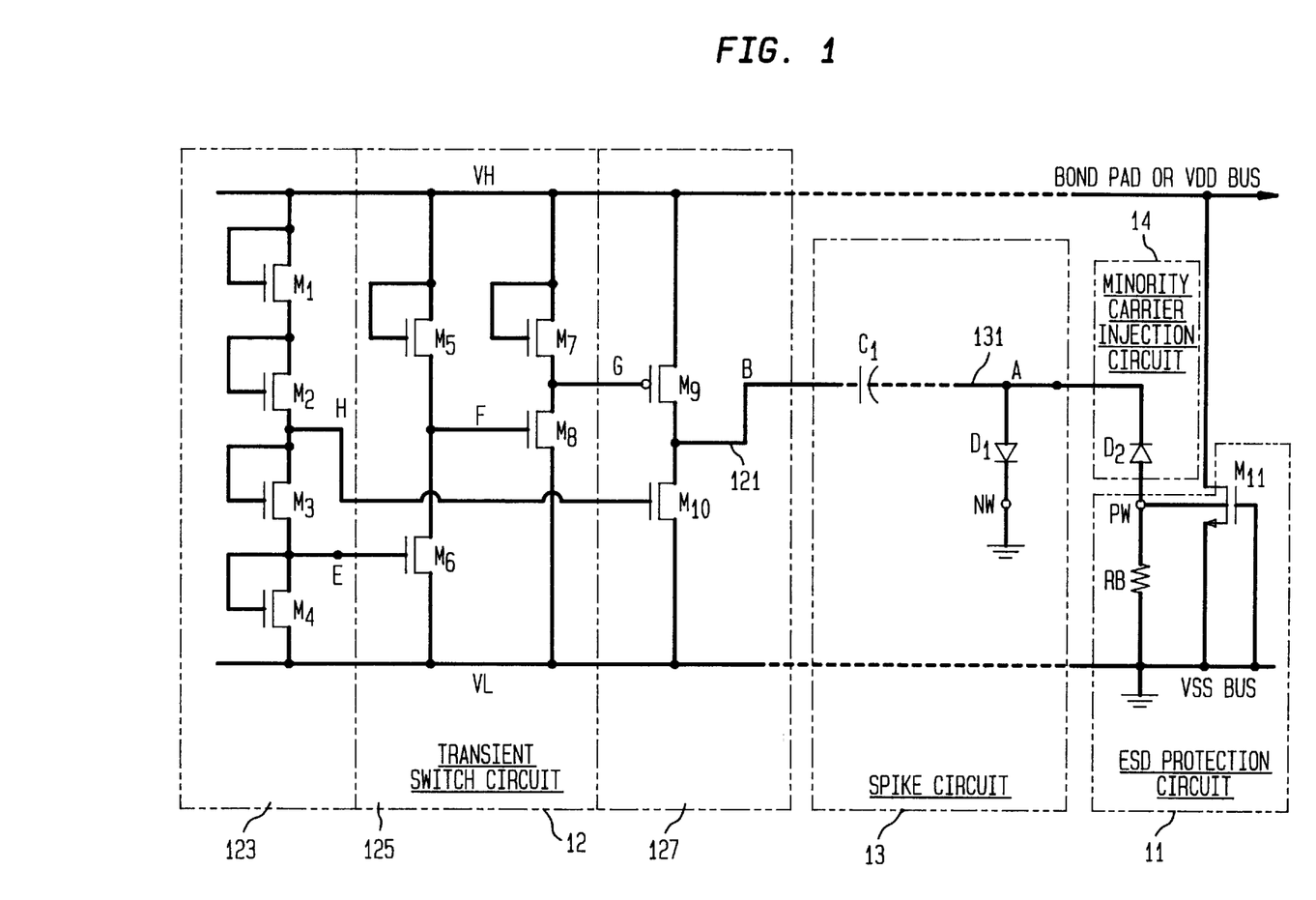
FIG. 1 shows a first preferred embodiment of the invention.

As shown in FIG. 1, the first embodiment of the invention includes an ESD protection circuit 11, an transient switch circuit 12, a spike generator 13 and a minority-carrier injection circuit 14. The VH of the transient switch circuit 12 is electrically coupled to the VDD bus, or alternatively, electrically coupled to an IC pin via a pull-up device. The VL of the transient switch circuit 12 is electrically coupled to VSS. During a positive VDD-to-VSS or pin-to-VSS ESD event, the voltage difference of the VH and VL of the transient switch circuit 12 increases rapidly along with the transient ESD voltage. As a consequence, the voltage signal 121 at the output node of the transient switch circuit 12 also increases initially during the initial ESD transient.

In particular, the transient switch circuit 12 includes a control signal generator which includes a voltage divider 123, a predrive circuit 125. The transient circuit 12 further includes a transient voltage generator 127 the function of which will be clear hereinafter.

In a first embodiment, the voltage divider 123 consists of four diode-configured NMOS transistors M1, M2, M3 and M4 connected in cascade as shown. A first control signal of the control signal generator is generated at one voltage divide node H. The sizes of each transistors are chosen such that an optimal speed and current drivability are achieved. In one example, the transistor sizes are W/H=5/5, 5/5, 5/5 and 1/1 respectively for M1, M2M3 and M4. The predrive circuit 125 consists of M5, M6, M7 and M8 connected as shown. The M5 and M7 are diode-configured NMOS transistors which have sizes of W/H=3/1, 0.5/0.5 respectively. In one embodiment, M6 and M8 are pull-down NMOS transistor having sizes W/H=4/0.5, 1/0.5 respectively. The gate of M6 is connected to the common terminal E to M3 and M4. The gate of M8 is connected to the common terminal F to M5 and M6. The transient voltage generator 127 consists of PMOS transistor M9 and NMOS transistor M10 connected in cascade as shown. The gate of M9 is connected to the common terminal to M7 and M8 at which a second control signal of the control signal generator is generated. The gate of M10 is connected to the common terminal to M2 and M3, the node H, for receiving the first control signal. The common terminal B to M9 and M10 is the output terminal of the transient switch circuit 12 which generates the voltage signal 121.

During an ESD event, the output terminal of the transient switch circuit 12 generates a voltage signal 121 which increases initially for a time period and, after a time point, decreases sharply to around zero volt. In details, during a first period, the voltage at terminal F is larger than that at terminal E such that M6 is OFF. Also, during the first period, M10 is OFF and M9 is ON. During this first period, the voltage at terminal F keeps on increasing as VH increase with time. At a time point after which voltage at terminal E begins to be larger than that at terminal F, M6 is switched ON which renders downward transition of voltage at terminal F to VL value. This voltage decrease period at terminal F is noted as a second period. During downward transition of voltage at terminal F, a time point is reached after which M8 becomes OFF which results in a sharp increase of voltage at terminal G. Substantially at and after this time point, M10 becomes ON and M9 becomes OFF, and the voltage at terminal B begins to go downward sharply. The characteristic of the signal 121, which increases initially and drops sharply to almost zero volt during the ESD transient, is utilized by the successive circuits to generate a current spike which will be clear hereinafter. The actual simulation results are disclosed in FIG. 5(a) and 5(b). In the above embodiment of FIG. 1, the transient voltage generator 127 having M9 and M10 is provided. It is understood that M9 functions as an impedance element and M10 functions as a switch. However, alternative arrangements are possible. For instance, when M9 is replaced by other impedance element, i.e. a resistor, while the second control signal is dispensed, the function of the transient voltage generator 127 still works. As this arrangement is embodied, the decrease slope of the voltage signal 121 will be less sharper than that shown in FIG. 5(a). In other words, those equivalent alternatives are intended scope of protection of the invention.

The spike generator 13 includes a coupling capacitor C1 coupling the voltage signal 121 to a voltage-clamping device D1, for example, a p+/nwell diode D1 with the nwell tied to VSS. The output signal 131 of the spike generator 13 is therefore clamped to a positive voltage, say, around 0.8 v of the diode-clamping voltage during the upward transition of the voltage signal 121 at terminal B. On the other hand, the voltage signal 131 goes to a negative-voltage level during the downward transition of the voltage signal 121, and therefore the spike generator 13 serves as a negative-spike generator during the ESD transient. That is, the spike generator 13 is responsive to the voltage signal 121 and generates a corresponding current spike, as shown in FIG. 5(b), of a second voltage polarity opposite to the first voltage polarity during an ESD event. The minority-carrier injection circuit 14 has an input terminal adapted to receive the current spike signal and injects minority carriers into the substrate. These minority carriers then triggers turn-on of the ESD protection circuit 11 to conduct a large current due to the ESD event to Vss. In a preferred embodiment, the minority-carrier injection circuit 14 is a diffusion diode D2 formed by a diffusion n+ region in the p type substrate. Due to the arrangement of the diode D2, the signal 131 is further clamped to a negative voltage, say, around −0.8 v of the diode-clamping voltage during the downward transition of the voltage signal 121 as shown in FIG. 5(a).

Figure 2:
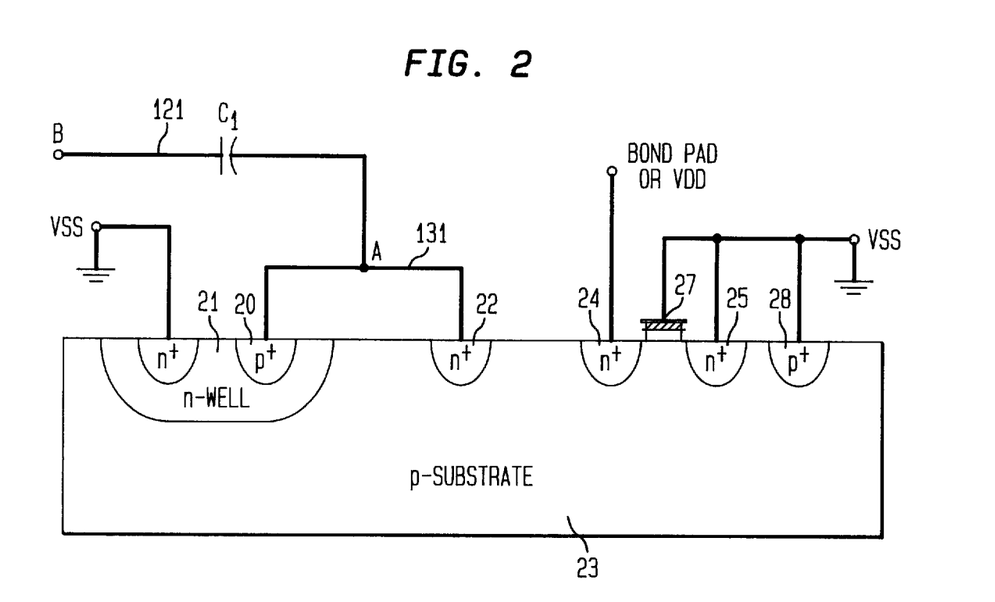
FIG. 2 shows the process technology view of the MOS-FET M11, D1 and an adjacent n+/pwell diode D2 of FIG. 1.

The negative current spike is used to trigger the ESD protection device 11, i.e. a NMOSFET M11 as shown in FIG. 1, by injecting electrons (minority carriers) into pwell through a n+/pwell junction of the diode D2. The n+ diffusion, pwell, and the reverse-biased diffusion-substrate junction of the NMOSFET M11 form a parasitic (lateral) bipolar transistor, with RB represents the substrate (or pwell) resistance. From the parasitic bipolar action and the bipolar gain, part of the injected electrons are collected at the reverse-biased drain-substrate junction of the NMOSFET M11. Due to impact ionization and high electric field in the drain-substrate junction, the minority carriers flow across the drain-substrate junction cause more carrier to be generated. Among those, minority carriers (electrons) are collected by the drain electrode, while majority carriers (holes) flow into the base (pwell or substrate). These carriers flowing in the substrate cause a local-substrate potential to build up, which forward biases the source-substrate junction of the NMOSFET M11 and in return causes more electrons to be injected into the pwell. Thus, through this continuous loop, it quickly leads to the snap-back condition of the NMOSFET M11. As a result, the trigger voltage of the NMOSFET M11 is lowered. By referring to the FIG. 2 together with FIG. 1, it is seen the p+ diffusion region 20 and nwell 21 constitute the diode D1. The n+ diffusion region 22 and p-substrate 23 constitute the diode D2. The n+ diffusion region 24, the gate 27 and n+ diffusion region 25 constitute the NMOSFET M11. It is also seen that n+/pwell junction diode D2 sits adjacent to M11 with a common grounded p-substrate 23 (or pwell).

Figure 5A:
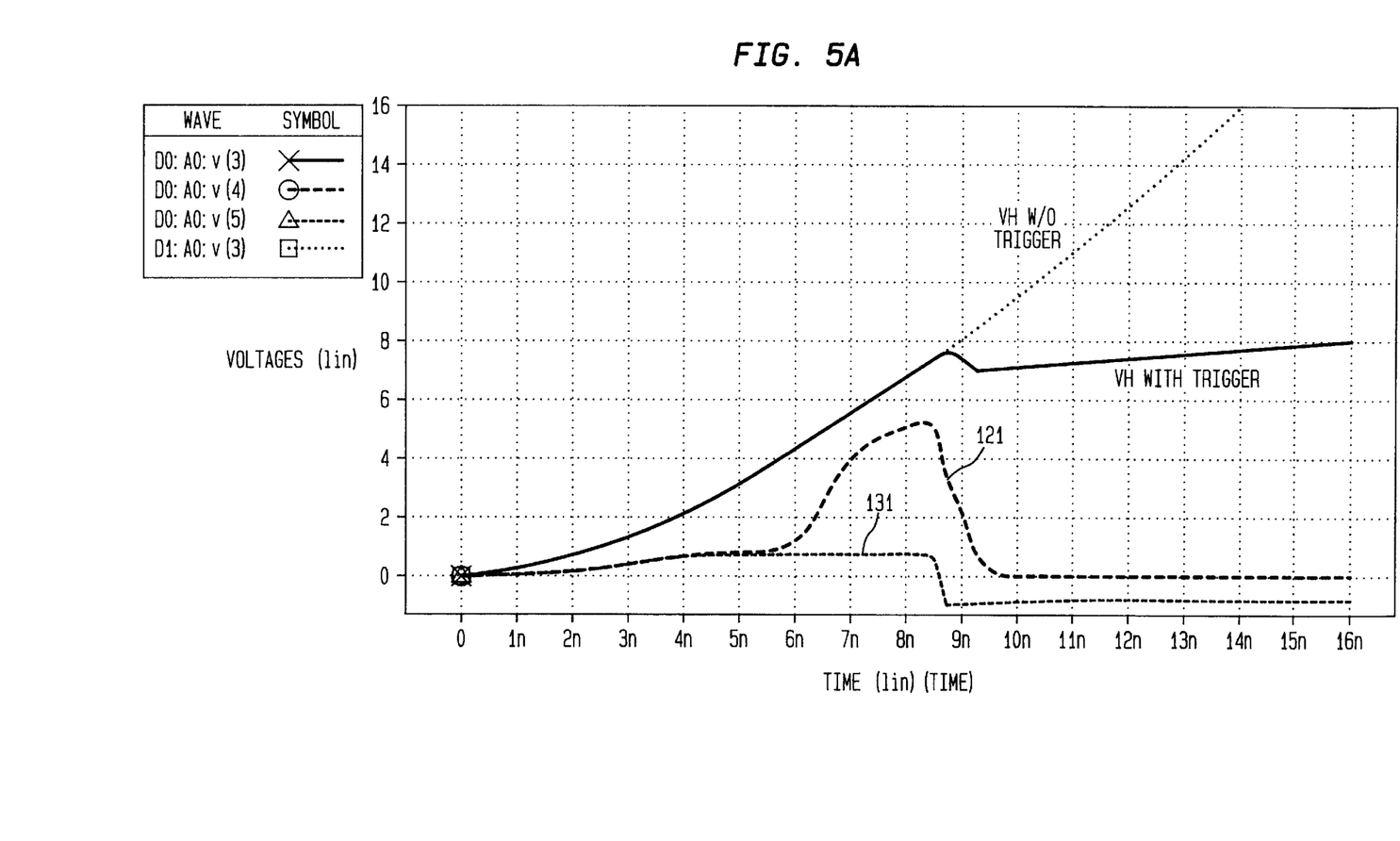
FIG. 5(a), and 5(b) respectively shows signal variation at respective nodes of the first embodiment of the invention during an ESD event.
Figure 5B:
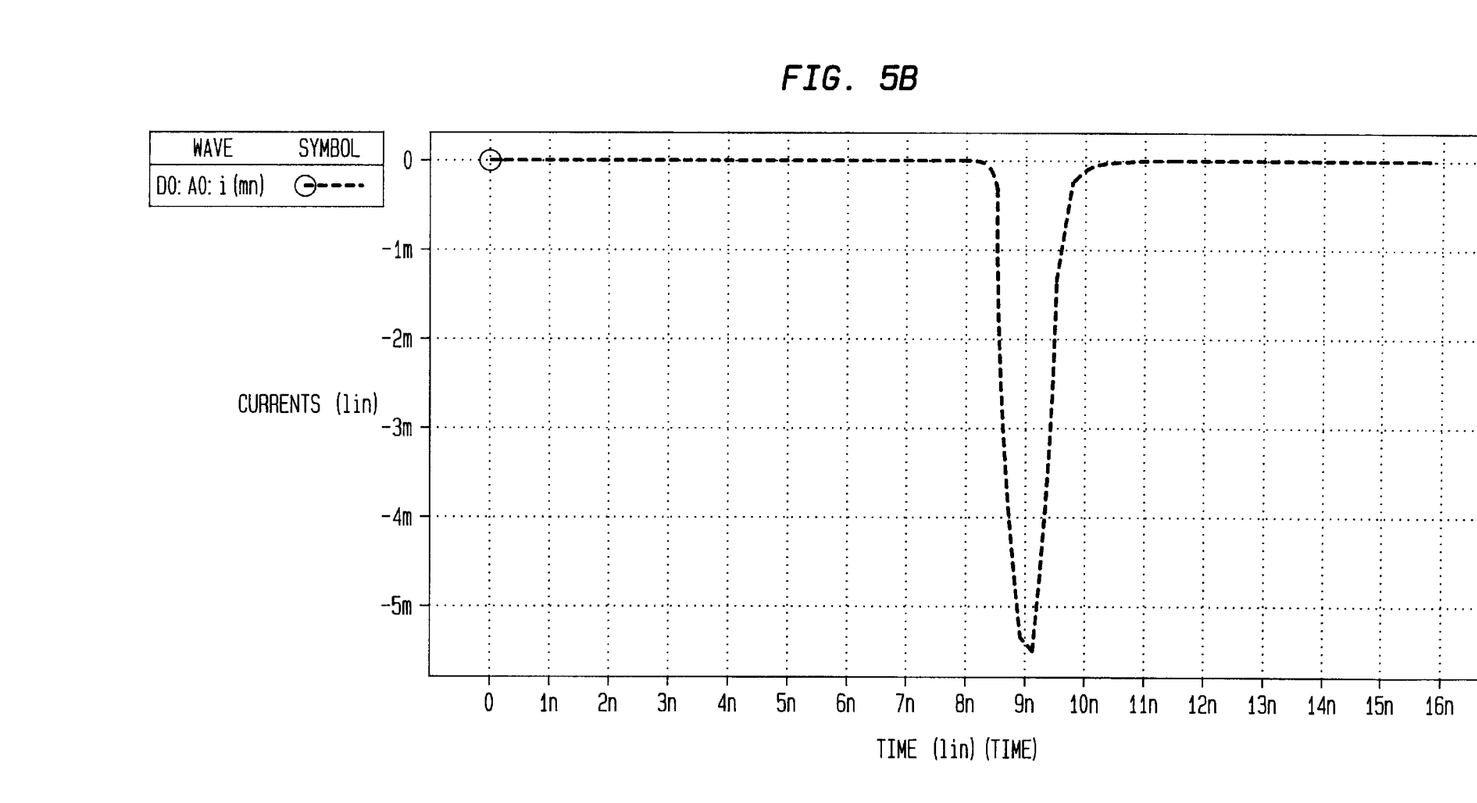

FIG. 5(a), and (b) respectively shows signal variation at respective nodes of the first embodiment of the invention during an ESD event. The simulation results are obtained under conditions of (1),2.5 KV Human Body Model ESD events; (2) 1 nanoFarad chip (power bus) capacitance; (3) C1=1 pF. The signal 131 is pinned at roughly −0.8 V to +0.8 V due to the diodes D2 and D1. From FIG. 5(B), it is shown that the negative current spike occurs when the signal 131 transits from positive value to negative value which enables minority carriers (electrons) to be injected into the p-substrate 23 and the trigger voltage of M11 is lowered. The ESD protection device M11 is triggered when a negative current spike of sufficient magnitude occurs. The larger the negative current spike is, the lower the trigger voltage will be. Since negative pulses can be generated within a few nano-seconds while the rapidly increasing VDD-to-VSS voltage is still less than 10 volt, the trigger voltage of the NMOSFET M11 can be reduced from around 13 volts down to less than 10 volts. As a design example, a capacitance C1 of 1 pF can be used which generates negative pulses with roughly 5 mA transient currents for forward biasing the n+/pwell diode D1 during a Human-Body-Model ESD transient. And larger transient current spike can be generated with a larger C1 accompanied by an adequate driving strength of the transient voltage generator 127 and other circuit elements.

For the present invention, latch up is not a concern since the nwell 21 of the p+/nwell diode D1 is grounded and having the same potential as the p-substrate 23 (or pwell). Also, neither additional implant nor process complexity is required.

Figure 3:
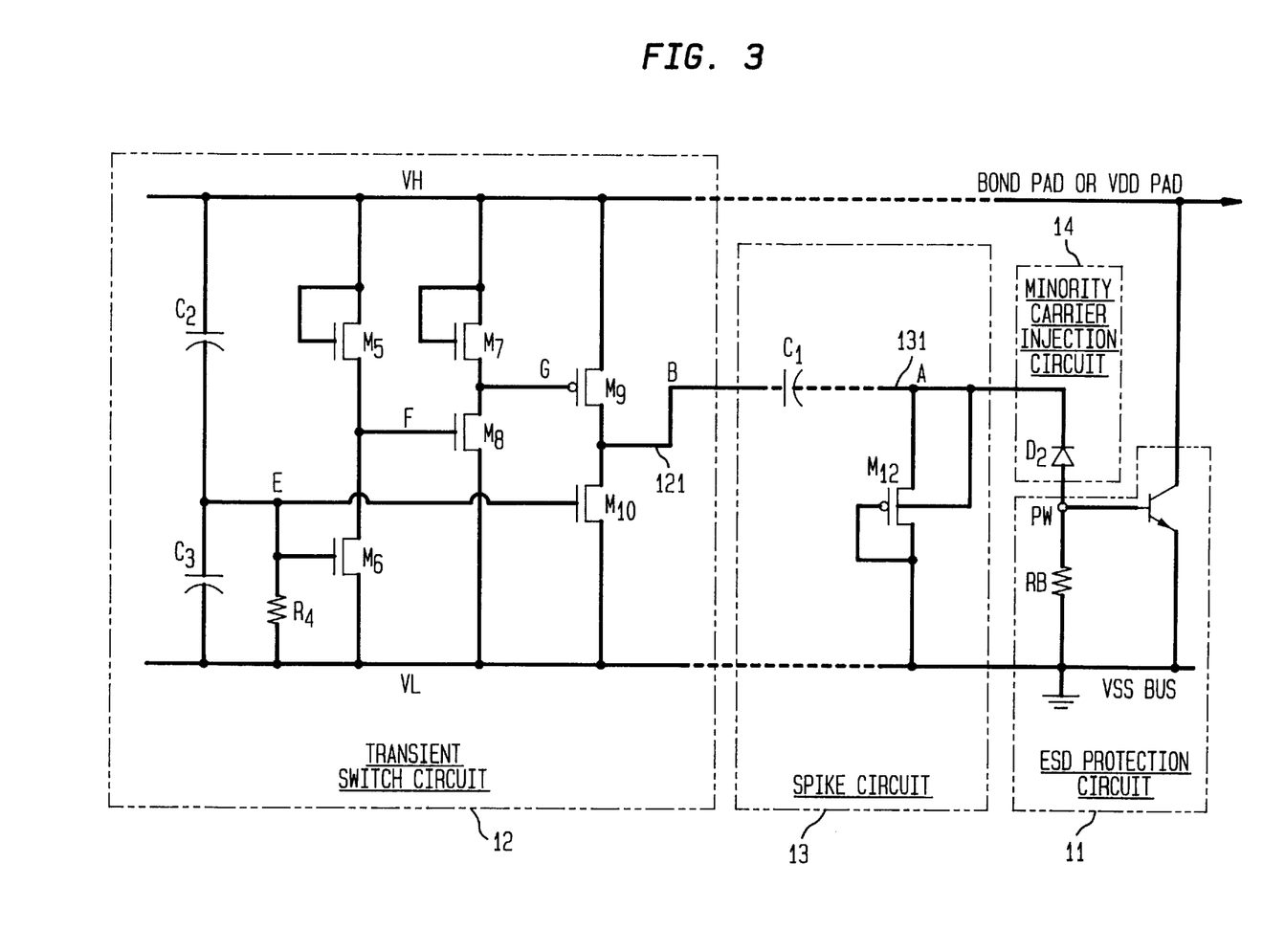
FIG. 3 shows a second preferred embodiment of the invention.

As shown in FIG. 3 and compared with FIG. 1, the voltage divider of the second embodiment of the invention includes a first capacitor C2 and a second capacitor C3. The elements having same reference numeral in FIG. 1 and FIG. 3 represents same device and performs same function. In FIG. 3, the gate of M10 is connected to the common node to C2 and C3 which is a voltage divide node E. And the voltage at terminal E is further divided by the voltage-divider resistor R4. Overall operation of FIG. 3 is similar to that of FIG. 1. In a preferred embodiment, the time constant of R4 (C2C3)/(C2+C3) is at least 10 nano-seconds such that the terminal E is pulled low to shut off M6 and M10 after the ESD event. Compared with the first embodiment, the second embodiment consumes less power during its normal operation.

Figure 4:
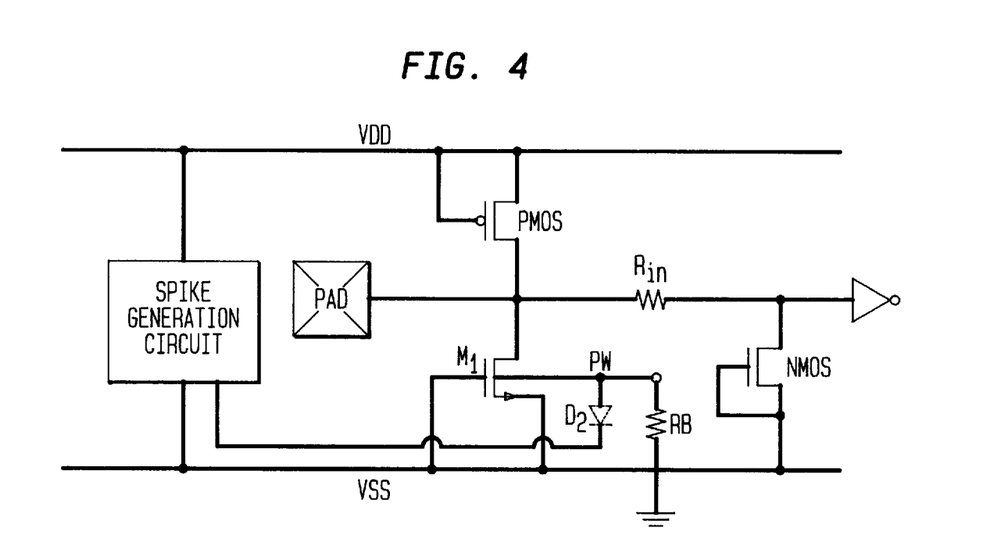
FIG. 4 shows a third preferred embodiment of the invention.

It is shown in FIG. 3, a bipolar device B1 is used as an embodiment for the primary ESD protection device. The triggering mechanism of a bipolar device is the same as that for a MOSFET shown in FIG. 1. In addition, a diode-configured PMOSFET M12 is used as a positive-voltage clamping device instead of the p+/nwell diode D1 of FIG. 1. In a third embodiment of the invention shown in FIG. 4, in which the spike generation circuit is powered by VDD and VSS bus, with the VDD bus coupled to an IC pin via a pull-up PMOS device and the VSS bus coupled to the IC pin via a pull-down NMOS device. It is to be noted that spike generation circuit includes functions of transient switch circuit 12 and spike generator 13 of FIG. 1. The ESD protection device NMOSFET M1 is used to protect an input pin, instead of a power bus, during an ESD event. In other words, this embodiment is applicable for pin-to-Vss ESD event. Alternatively, the primary ESD protection device can be any ESD protection device that has a reverse-biased diffusion-substrate junction in an ESD event. Alternatively, a dedicated bus (sometimes called ESD bus) can be used instead of the VDD bus for powering the spike generation circuit. As shown, the negative-voltage clamping device is diode D2. The VH (not shown) of the spike generation circuit can be electrically coupled to an IC pin via a pull-up device, i.e. a p+/nwell diode, a PMOSFET or a pnp transistor.

Figure 6:
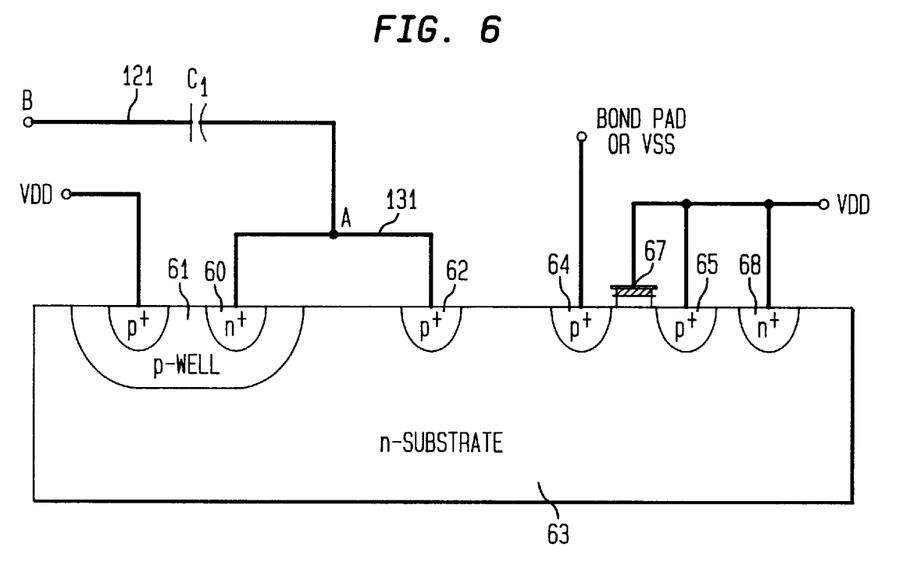
FIG. 6 shows an opposite variation of FIG. 2, in that the n and p type materials are completely reversed.

Although the p-substrate is used an example in the aforesaid preferred embodiments. It is clear that, the spirit of the invention also applies to a n-substrate. FIG. 6 shows an opposite variation of FIG. 2, in that the n and p type materials are completely reversed. Comparing FIG. 2 with FIG. 6, the holes become the minority carriers in the n-substrate. Therefore, during a negative VSS to VDD transient (or positive VDD to VSS transient), when the node B is connected to a transient switch circuit like the one shown in FIG. 1, holes are injected into the n-substrate 63 from the node A through the diode constituted by p+ region 62 and n-substrate 63. The injected holes help triggering turn-on of the PMOSFET constituted by the p+ diffusion region 64, the gate 67 and p+ diffusion region 65.

I claim:

1. An electrostatic discharge (ESD) protection structure for an integrated circuit constructed on a substrate of a first type, comprising:

an ESD protection means constructed on the substrate;

a transient switch circuit having an output terminal for generating a voltage signal of a first voltage polarity during an ESD event;

a spike generator, responsive to the voltage signal, for generating a current spike of a second voltage polarity opposite to said first voltage polarity;

a trigger means, having an input terminal adapted to receive said current spike, for triggering the turn-on of the ESD protection means to conduct a large current due to the ESD event.

2. The structure of claim 1, wherein the value of the voltage signal increases initially and correspondingly with the ESD event, and then decreases sharply at a switch point during the ESD event.

3. The structure of claim 2, wherein the current spike is generated substantially around and after the switch point.

4. The structure of claim 1, wherein the trigger means triggers turn-on of the ESD device by using the current spike to inject minority carriers into the substrate.

5. The structure of claim 1, wherein the transient switch circuit comprises:

first means, responsive to the ESD event, for generating a first control signal;

second means for generating said voltage signal, under control of the first control signal.

6. The structure of claim 5, wherein the first means further generates a second control signal, and the second means is also controlled by the second control signal.

7. The structure of claim 5, wherein the first means comprise:
   a voltage divider including at least two impedance elements connected at a common node at which the first control signal is generated.
8. The structure of claim 6, wherein the first means comprise:
   a voltage divider including at least a first, a second and a third impedance elements connected in cascade, the voltage divider having a first node, which connects the first and the second impedance elements, for generating the first control signal and having a second node, which connects the second and the third impedance elements, for generating a third control signal.
9. The structure of claim 8, wherein the first means comprises:
   third means, responsive to the ESD event and the third control signal, for generating the second control signal.
10. The structure of claim 6, wherein the second means comprises:
    a PMOS transistor having a gate terminal receiving the second control signal, and having a drain terminal coupled to a Vdd bus, the PMOS transistor is turned ON for a first time period and turned OFF substantially after the switch point;
    a NMOS transistor connected to the PMOS transistor in cascade at a common node for generating the voltage signal, the NMOS transistor having a gate terminal receiving the first control signal, and having a source terminal coupled to a Vss bus, the NMOS is OFF for the first time period and turned ON substantially after the switch point.
11. The structure of claim 1, wherein the spike generator comprises:
    a capacitive coupling means having a first terminal defining an input terminal of the spike generator, and having a second terminal defining an output terminal of the spike generator;
    a voltage clamping means coupled between said output terminal of the spike generator and said substrate, for limiting the voltage value at the output terminal to a clamping voltage of said first voltage polarity.
12. The structure of claim 11, wherein said voltage clamping means is a diode.
13. The structure of claim 11, wherein said voltage clamping means is a diffusion diode formed by a diffusion region of the first type in a well region of a second type, wherein said well region electrically connects to the substrate.
14. The structure of claim 11, wherein said voltage clamping means is a diode-configured MOSFET.
15. The structure of claim 11, wherein said voltage clamping means is a diode-configured MOSFET inside a well of a second type, wherein a gate and a drain terminal of the MOSFET is electrically connected to the substrate, while a source terminal of the MOSFET and the well of the second type are electrically connected to said output terminal of the spike generator.
16. The structure of claim 1, wherein the ESD protection means is a bipolar transistor.
17. The structure of claim 1, wherein the ESD protection means is a MOSFET transistor.
18. The structure of claim 1, wherein the ESD protection means is a diode.
19. The structure of claim 1, wherein the trigger means is a diffusion diode formed by a diffusion region of a second type in the substrate, the diffusion diode injecting minority carriers into the substrate which triggers the turn-on of the ESD protection means.
20. The structure of claim 19, wherein said diffusion region of the second type is adjacent to a second diffusion junction of the ESD protection means, said second diffusion junction is reverse biased during the ESD event.
21. The structure of claim 19, wherein the minority carriers are injected into the substrate via the diffusion diode under forward-bias state which is caused by the current spike of the second voltage polarity during the ESD event.
22. The structure of claim 21, wherein the minority carriers enhance majority or minority carriers generation caused by impact ionization at a second diffusion junction of the ESD protection means, the second diffusion junction is reversed-biased during the ESD event.
23. The structure of claim 1, wherein, during the ESD event, an ESD zapping voltage is applied between a VDD pin and a VSS pin.
24. The structure of claim 1, wherein, during the ESD event, an ESD voltage is applied between an IC pin and a power-bus pin.
25. The structure of claim 1, wherein, during the ESD event, an ESD voltage is applied between an IC pin and a VSS bus pin.
26. The structure of claim 25, wherein a VDD power line is connected to said IC pin via a pull up diode, said transient switch circuit is powered by the VDD and VSS.
27. The structure of claim 25, wherein a VDD power line is connected to said IC pin via a pull up PMOSFET, said transient switch circuit is powered by the VDD and VSS.
28. A method for triggering an electrostatic discharge (ESD) protection circuit for an integrated circuit constructed on a substrate of a first type, the ESD protection circuit including an ESD protection means constructed on the substrate, comprising the following steps:
    generating a voltage signal of a first voltage polarity during an ESD event;
    generating, responsive to the voltage signal, a current spike of a second voltage polarity opposite to said first voltage polarity;
    applying said current spike to trigger the turn-on of the ESD protection means to conduct a large current due to the ESD event.
29. The method of claim 28, wherein the value of the voltage signal increases initially and correspondingly with the ESD event, and then decreases sharply at a switch point during the ESD event.
30. The method of claim 28, wherein the current spike injects minority carriers into the substrate to trigger turn-on of the ESD protection means.
31. The method of claim 28, wherein the trigger of the turn-on of the ESD protection means is performed by a diffusion diode, formed by a diffusion region of a second type in the substrate, which injects minority carriers into the substrate.
32. The method of claim 31, wherein said diffusion region of the second type is adjacent to a second diffusion junction of the ESD protection means, said second diffusion junction is reverse biased during the ESD event.
33. The method of claim 31, wherein the minority carriers are injected into the substrate via the diffusion diode under forward-bias state which is caused by the electric pulse of the second voltage polarity during the ESD event.
34. The method of claim 33, wherein the minority carriers enhance majority or minority carriers generation caused by impact ionization at a second diffusion junction of the ESD protection means, the second diffusion junction is reversed-biased during the ESD event.

* * * * *